United States Patent [19]
Feistritzer et al.

[11] Patent Number: 5,415,674
[45] Date of Patent: May 16, 1995

[54] CEMENTED CARBIDE SUBSTRATE HAVING A DIAMOND LAYER OF HIGH ADHESIVE STRENGTH

[75] Inventors: Stefan Feistritzer; Johann Kanz; Wilfried Schintlmeister, all of Reutte, Austria

[73] Assignee: Schwartzkopf Technologies Corporation, New York, N.Y.

[21] Appl. No.: 217,257

[22] Filed: Mar. 24, 1994

[30] Foreign Application Priority Data

Mar. 26, 1993 [AT] Austria ................................ 612/93

[51] Int. Cl.⁶ ........................... B24D 3/06; B05D 3/00
[52] U.S. Cl. ................................. 51/293; 427/307; 427/309; 427/122; 427/249; 428/408; 423/446
[58] Field of Search ............... 427/249, 122, 307, 309; 428/408; 423/446; 156/DIG. 68; 51/293

[56] References Cited

U.S. PATENT DOCUMENTS 5,236,740  8/1993  Peters et al. .................... 427/249

FOREIGN PATENT DOCUMENTS 0374923  6/1990  European Pat. Off. .
0384011  8/1990  European Pat. Off. .
0464012  1/1992  European Pat. Off. .
0500119  8/1992  European Pat. Off. .
05-330959 12/1993 Japan .

*Primary Examiner*—Roy V. King
*Attorney, Agent, or Firm*—Morgan & Finnegan

[57] ABSTRACT

An improved process for improving the adhesion between a cemented carbide substrate and a diamond layer deposited thereon by removing the binder phase of the cemented material from the surface of the substrate prior to diamond coating. For this purpose, the process of the invention uses an apparatus as is conventionally used in various technologies for the CVD process of diamond layers. The process parameters are here altered from those of the conventional diamond coating in such a way that binder metal is evaporated from a very narrow boundary zone of the substrate surface, utilizing the reaction heat from the recombination of previously dissociated hydrogen gas directly at the substrate surface.

11 Claims, No Drawings

CEMENTED CARBIDE SUBSTRATE HAVING A DIAMOND LAYER OF HIGH ADHESIVE STRENGTH

FIELD OF THE INVENTION

The invention relates to a process for improving the adhesion between a cemented carbide substrate formed of a hard material and binder metal and a diamond layer applied thereto by deposition from the gas phase, by removing binder metal from the surface of the cemented material prior to application of the layer. The invention relates in particular to a process in which the removal of binder metal from the surface and the application of diamond layers to cemented carbide substrates by a hot filament coating process are carried out successively in the same apparatus.

BACKGROUND

The development of diamond coatings on substrate materials applied by means of chemical vapor deposition (CVD) processes including hydrogen dissociation has led to different coating technologies and the provision of corresponding apparatus. Among the various techniques, preferred representatives are coating by the so-called hot filament (HF-CVD) process, by the microwave process and by the jet process including a plasma jet.

The various customary processes and their basic methods of operation have been summarized in a review article by B. Lux and R. Haubner in the Proceedings of the 12th International PLANSEE Seminar 1989, Volume 3, p. 615 ff, edited by H. Bildstein and H. Ortner. The review refers to 150 specialist papers, and thus a more detailed description of the customary techniques can be omitted here.

Among the various possible applications, the application of wear-reducing diamond layers to cemented cutting or machining inserts promises high technological utility and has already reached a high state of development. However, a significant problem which has only been insufficiently solved to date is the poor adhesion of the diamond layer to the substrate surface.

It has already been recognized that in a cemented material comprising a hard component and a binder metal, the binder metal found in a boundary zone close to the surface of the substrate is responsible for the poor adhesion properties. It is therefore not surprising that many processes have already been proposed for reducing the interfering influence of the binder metal at the surface.

EP 0 384 011 A1 gives, for the prior art, a review of measures which have hitherto been proposed for increasing the adhesive strength between a substrate material, in particular a cemented material, and a diamond layer deposited thereon. A first technique relates to the application of an intermediate layer, containing none of the binder metals iron, cobalt and/or nickel, between the cemented material and the diamond layer. However, the intermediate layer which can, from a practical point of view, only be applied to a limited thickness, does not provide a sufficient barrier to the migration of the binder to the coating surface. If, as proposed, a tungsten and carbon intermediate layer, for example, a $W_2C$-containing intermediate layer, is introduced, this brings with it the difficulty that different apparatuses for the deposition of the intermediate layer and the deposition of the diamond layer are additionally required.

According to another process variant, the application of a tungsten intermediate layer to a cemented cutting insert for metal cutting does substantially improve the adhesion problem. Since the W is converted at least partially into WC during the subsequent diamond coating, the intermediate layer is not a sufficient diffusion barrier.

According to a further previously described process, the cobalt in a cemented phase containing cobalt as binder metal is etched away from the surface of the cemented material by means of acid treatment. However, the etching can not be restricted to a boundary zone close to the surface, so that deep-reaching pores are formed there. A deep Co-depleted boundary zone leads to unacceptable brittleness in the boundary zone. The roughness and structure of the surface are unfavorable for subsequent coating. This greatly reduces the adhesion of the subsequent diamond layer.

According to a last process mentioned there, the surface of the cemented material is ground prior to the coating procedure. Nevertheless, surface regions of binder metal remain, on which a graphite phase instead of a diamond phase is still formed in the subsequent coating process, and graphite formation is a main cause of poor adhesion between substrate and diamond layer.

The process protected in EP 0 384 011 A1 directly follows this prior art. The grinding process is there followed by decarburization of the tungsten carbide/cobalt substrate surface with recrystallization of tungsten carbide. The decarburization is carried out by supplying oxygen gas to the substrate surface and proceeds simultaneously with the removal of metal, including in particular binder metal, from the surface, preferably as volatile oxide. A disadvantage of this process is the danger that the oxygen introduced leads to permanent, undesired oxide formation in some regions of the substrate. Grinding of the substrate surface necessarily causes the deposition there of impurities which cannot be completely removed during the subsequent decarburization process without simultaneous, lasting impairment of the surface structure or the surface roughness with regard to good adhesion of diamond layers.

A significant disadvantage of this process is finally the requirement for suitable equipment besides the equipment for the CVD diamond coating. Thus, the Ta or W filaments customarily used in hot filament equipment would become unusable as a result of oxygen treatment.

It is an object of the present invention to lastingly improve the adhesion improvement between a cemented carbide substrate and a diamond layer applied thereto, without incurring the above mentioned disadvantages in the use of the known processes. The quality of adhesion to be achieved should be viewed, in particular, in the context of the use of products coated in this way as a cutting insert or as a machining tool, where, because of high local thermal and mechanical stresses, particularly high demands are made in this respect.

SUMMARY OF THE INVENTION

The object of the invention is achieved by a process for improving the adhesion between a cemented carbide substrate formed of a hard material and binder metal, and a diamond layer applied thereto by deposition from the gas phase, by removing binder metal from the surface of the cemented material prior to application of the layer, the process entailing

- using, for the removal of the binder metal, the same type of apparatus as is conventionally used for applying diamond layers via carbon-containing gases and hydrogen dissociation at the reaction location,
- establishing in the substrate interior temperatures below an upper limit above which there commences in the interior a material change which affects the intended use of the diamond coated substrate,
- creating at the substrate surface, via the presence of dissociated hydrogen, conditions resulting in thermal evaporation of binder metal from a boundary zone close to the surface of the substrate, and
- recrystallizing, in addition to and simultaneously with the evaporation of binder metal, the hard material remaining in the boundary zone whereby the substrate surface is restructured and roughened.

For the purposes of this invention, cemented carbide substrates are cemented carbides or mixed carbides using metals of groups IVa–VIa of the Periodic Table, but also cemented materials in which the hard material comprises, wholly or in part, carbonitride and/or nitride materials, for example, cermets. Industrially important binder metals are cobalt and nickel, but also alloys thereof, and additives such as iron and chromium. The proportions of binder metal in the cemented material customarily lie between 4 and 30% by weight. In accordance with a preferred use of such coated products as cutting or machining inserts, the term includes all hard material/binder metal combinations which are used for such applications.

The term gas-phase reaction includes CVD technology (chemical vapor deposition) as distinct from, for example, PVD processes (physical vapor deposition) such as ion sputtering of the layer material from a solid vaporizer source.

Among the many apparatuses and processes mentioned in the introduction for CVD diamond coating, the hot filament process is currently, thanks to its comparatively large coating area, of prominent importance, and accordingly also for the binder-metal removal in accordance with the present invention. Accordingly, a plurality of the subclaims relate to particular embodiments of the invention using the hot filament technique.

It is equally conceivable to carry out the process of the invention and also the removal of the binder metal in a single apparatus, or to use different processes and apparatus, one for the removal of the binder metal according to the invention, the other for the subsequent application of a diamond layer itself. It is possible in this case to carry out the removal of the binder metal and the subsequent diamond coating continuously in one and the same coating facility in two directly successive process steps. However, it may also be necessary to separate the processes of binder removal and diamond coating, although carried out in one and the same apparatus, and to temporarily remove the substrate from the apparatus in those cases where the cemented material freed of the binder metal phase in boundary zones close to the surface is subjected to a further pretreatment, such as scratching with diamond grain, prior to the application of the diamond layer.

DETAILED DESCRIPTION OF THE INVENTION

In accordance with the invention as described herein, it is essential to the invention to ensure that the evaporation of the binder metal occurs only from a narrow boundary zone close to the surface, but in that narrow boundary zone occurs largely completely. The binder metal vaporization is carried out in the form of the pure metal, but possibly also in the form of metastable metal hydrides.

Since a solid three-dimensional structure of carbide and binder metal components is originally present in the cemented phase, completely freeing the surface of binder metal is associated with a structural change in the form of hard material recrystallization in the surface region. The recrystallization of the hard material components, in particular the carbide components, proceeds on the one hand via dissolution in a tungsten/carbon-binder metal phase and the redeposition of hard material, in particular carbides from the above-mentioned mixed phase, and on the other hand by recrystallization of the hard material grain itself because of the high surface temperature. Simultaneously, there is formed a closed, roughened hard material surface structure. The WC grains at the surface have about the same grain size as the remaining microstructure of the cemented material. The average surface roughness is then about half, or even less, of the average grain diameter. The binder metal evaporation process shall occur exclusively in a surface boundary zone having a maximum thickness of a few microns. During this process the remaining volume of the cemented substrate must be kept at a temperature which is sufficiently low for significant material migrations and material changes not to occur.

Iron, cobalt, and nickel are the binder metals preferably used in cemented phases. The vaporization temperatures of these metals are about 3000° C. However, diffusion and phase changes in cemented materials can no longer be neglected from temperatures of 900° and above. Taking into account the good thermal conductivity of cemented materials, such extremely different temperature conditions at the surface and in the interior of the substrate can only be achieved by inclusion of hydrogen and its reaction chain. It is known that in equipment for CVD diamond coating the hydrogen supplied is, depending on the technique and apparatus used, dissociated either on the hot filaments or in the microwave plasma or else in the region of the plasma arc, and in direct timewise and spatial proximity thereto, is recombined at the surface of the substrate to again form $H_2$ molecules in a strongly exothermic reaction. It was, then, surprising and not foreseeable that the process heat of the exothermic process at the substrate surface is sufficient to locally evaporate binder-phase metals and to recrystallize the hard material phase, with or without hydride formation. However, the average macroscopic surface temperature lies far below the binder metal vaporization temperature, so that the liberation of binder metal is limited to a boundary zone very close to the surface of the substrate, in the direct proximity of which the exothermic $H_2$ recombination takes place at sufficient reaction density. This explains the fact that the conditions within a zone having a thickness only in the micro range towards the substrate interior change so much that no material reactions occur there anymore.

To achieve the best possible adhesion improvement conditions on the substrate surface, the ratio of hydrogen to carbon-containing gases, if desired mixed with a noble gas, plays an important role. The mixing of carbon-containing gases with the reaction gas cannot be completely omitted because otherwise sub-carbonization, such as the formation of the unwanted etaphase in the cemented material, occurs. However, if the concentration of the carbon-containing gas in the total atmosphere is too high, then premature deposition of graphite or even diamond occurs on the substrate surface, which, however, should basically be avoided in this process stage.

As a first approximation, the process of evaporation of binder metal from the substrate surface occurs under those conditions which are known for diamond coating by the CVD process.

The total pressure p of the gas atmosphere in the reaction chamber lies between 0.1 and 25 kPa. Unlike the ratios for diamond coating, the volume ratio of $H_2$ and hydrocarbon-containing gas may only vary between about $10^2$ and $10^3$.

The pretreatment time t for the surface removal of the binder metal is advantageously between 0.5 and 6 hours.

When using the hot filament technique and a corresponding apparatus, the temperature T of the heat conductor itself and the gap between the substrate surface and the heat conductor D have to be changed with respect to the process conditions for conventional diamond coating. While the diamond coating proceeds at heat-conductor temperatures of about 2000° C., the heating filament temperature for the process of the invention has to be brought to 2100° C. and above. At the same time, the gap D between substrate surface and heating filament has to be reduced compared to that in diamond coating, advantageously to values between 2 and 10 mm.

If the removal of the cobalt from the substrate surface is carried out by the hot filament process, the process parameters are advantageously as follows:
Filament temperature T=2250°-2300° C.
Gap between substrate and source of dissociated hydrogen D=2.5-3 mm
Total gas pressure in the reaction chamber p=1.3-2 kPa
Treatment time t=2.5-3 hours The process according to the present invention leads to a substantial increase in adhesive strength between cemented carbide substrate and diamond layer.

The pretreatment process is particularly economical and does not significantly burden the total production costs for a diamond-coated product if one and the same apparatus is used for the pretreatment of the invention and the subsequent diamond coating.

The improved adhesion of diamond layers to cemented cutting inserts will, in the following examples, be quantified in machining tests and compared with products produced by known processes.

Embodiments of the invention will now be more particularly described by way of example.

EXAMPLE 1

The substrates used are cemented carbide indexable inserts of geometry SPEW 120408 made of cemented carbide type K10 (94% WC+6% Co, average grain size $\sim 1\mu$). The substrate pretreatment according to the invention is carried out in a facility for diamond coating by the hot filament CVD process. These substrates are fixed on a level substrate holder and brought to a distance of 3 mm±1 mm between filaments and the surface to be coated of the indexable inserts.

Pretreatment occurs under the following conditions:
$T_{FIL}$=2250° C.
$T_{SUB}$=900° C. (measured in the interior of the substrate)
Gas phase: 0.5% $CH_4$ (remainder $H_2$), 1.3 kPa
Time:
10 minutes heating up
2 hours Co vaporization
10 minutes cooling down Subsequent metallographic examination of the substrate in a scanning electron microscope confirmed the removal of the Co from the substrate surface with simultaneous roughening of the surface.

To obtain quantitative information about the improvement in adhesion thereby achieved, indexable inserts pretreated and then coated by this process were compared with others, some of which had not been pretreated and others of which had been pretreated by the conventional etching method (3 or 5 minutes in boiling 10% strength hydrochloric acid). Indexable inserts pretreated in this way were subsequently provided with a diamond layer about 8$\mu$ thick by the hot filament CVD process.

The specimens were then subjected to both a Rockwell adhesion test and also to a machining test (turning of cast aluminum/silicon alloy GAlSi 13 and GAlSi 20). The test conditions for the test using Rockwell indentation were: Load 62.5 kg; Indentor point:
Radius 0.2 mm, angle of cone 120°.
The machining conditions were:
for GAlSi 13:
Cutting speed (Vc)=500 m/min
Feed (f)=0.1 mm/rev
Depth of cut ($a_p$)=1 mm (with cooling) for GAlSi 20:
$V_c$=300 m/min; f=0.1 mm/rev; $a_p$=1.5 mm The tests showed a much better adhesive strength of the layer for indexable inserts which had been subjected to the Co vaporization process prior to diamond coating than for those which had not been pretreated or had been acid treated by the conventional method. Table 1 shows the essential test results.

EXAMPLE 2

In this case SPEW 120408 indexable inserts in accordance with Example 1 were pretreated by the microwave CVD process as cited in the introduction with regard to the prior art. The small yield of atomic hydrogen allowed the pretreatment of only a single specimen each time. The indexable insert was dipped into the spherical plasma in such a way that the flanks too were fully exposed to the plasma. The substrate was neither additionally heated nor cooled. It was in contact with the uncooled substrate holder.
Process conditions:
Microwave power=1500 W
$T_{SUB}$=500° C. (measured in the substrate interior)
Gas phase: 0.5% $CH_4$ (remainder $H_2$), 3.9 kPa
Time: 6 hours The substrates showed the same roughening of the surface by WC recrystallization as also occurs with the Co vaporization using the hot filament CVD technique. The adhesion properties too were comparable with those shown in Example 1.

EXAMPLE 3

The Co vaporization essential to the invention is carried out by the plasma jet process. In this process, an H$_2$/hydrocarbon gas mixture flows between the electrodes of the arc, the gas being heated to a temperature necessary to dissociate hydrogen. The high gas temperature requires cooling of the substrate or the substrate holder with water.

Process conditions:
Arc current = 30 A
Electrode voltage = 100 V
T$_{SUB}$ = 850° C. (measured in the substrate interior)
Gas phase: 0.5% CH$_4$, remainder H$_2$, 2 kPa
Time: 1 hour As in the earlier Examples 1 and 2, Co vaporization from the cemented carbide surface with simultaneous occurrence of surface roughening could be achieved here too. The adhesion of diamond layers on cemented carbide indexable inserts pretreated with the plasma jet corresponds approximately to the values shown for specimens no. 1 and 2 in Table 1.

TABLE 1

| Specimen No. | Pretreatment | Test by Rockwell indentation | MACHINING TEST Turning of GAlSi 13 | Turning of GalSi 20 |
|---|---|---|---|---|
| 1 | According to the invention | no flaking or buckling visible | no visible wear after 25½ min | with cooling: no wear after 10 min turning time |
| 2 | According to the invention | no flaking or buckling visible | no visible wear after 25½ min | without cooling: no wear after 10 min turning time |
| 3 | Untreated | About 1 mm$^2$ of flaking around the Rockwell indent and buckling over a large area around the indent | Flaking after 4½ min on flank | Specimen unusable |
| 4 | Untreated | About 1 mm$^2$ of flaking around the Rockwell indent and buckling over a large area around the indent | Flaking after 1½ min on flank | Specimen unusable |
| 5 | Etching 3 min | Buckling visible around the Rockwell indent | No wear after 25½ min | After 2 min flaking over a large area on flank |
| 6 | Etching 3 min | Buckling visible around the Rockwell indent | After 25½ min breaking off at cutting edge | After 2 min flaking over a large area on flank |
| 7 | Etching 5 min | Buckling visible around the Rockwell indent | Flaking after 4½ min on flank | Specimen unusable for test |
| 8 | Etching 5 min | Buckling visible around the Rockwell indent | Flaking after 8½ min on flank | Specimen unusable for test |

What is claimed is:

1. A process for improving the adhesion between a cemented carbide substrate, said substrate comprising a hard material and a binder metal, and a diamond layer applied to the substrate by deposition from a gas phase, said process comprising the following steps:
   a) removing said binder metal from a surface of the cemented carbide substrate prior to application of said diamond layer,
   b) establishing in the interior of the substrate temperatures no more than about 900° C. above which there commences in the interior a material change which affects the intended use of the diamond coated substrate,
   c) creating at the substrate surface, via the presence of dissociated hydrogen, conditions resulting in thermal evaporation of said binder metal from a boundary zone close to the surface of the substrate, and
   d) recrystallizing the hard material remaining in the boundary zone in addition to and simultaneously with the evaporation of said binder metal whereby the substrate surface is restructured and roughened.

2. The process as claimed in claim 1, wherein an apparatus is used for the removal of the binder metal and the same apparatus is used for the application of the diamond layer.

3. The process as claimed in claim 2, wherein a hot filament CVD (HF-CVD) process carried out in said apparatus is used for the removal of the binder metal and for the application of the diamond layer.

4. The process as claimed in claim 3, wherein the following process conditions are changed for the binder metal evaporation compared to the deposition of the diamond layer,
   a) a gap distance D between the substrate surface and hot filament elements used for the binder metal evaporation is reduced compared to the gap distance D used for the deposition of the diamond layer,
   b) the hot filament elements are brought to a higher filament temperature (T) value for the binder metal evaporation compared to the filament temperature (T) used for the deposition of the diamond layer, and
   c) a ratio of H$_2$ to hydrocarbon in a process gas found in a reaction chamber of the apparatus is changed to increase the proportion of H$_2$ in the process gas for the binder metal evaporation compared to the ratio of H$_2$ to hydrocarbon in the process gas used for the deposition of the diamond layer.

5. The process as claimed in claim 4, wherein the process gas is supplied at a total pressure p in the range of 0.1–25 kPa and in a volume ratio of H$_2$ to hydrocarbon in the range of $10^2$ to $10^3$.

6. The process as claimed in claim 3, wherein the removal of the binder metal is carried out over a process time t in the range of 0.5 to 6 hours.

7. The process as claimed in claim 3, wherein the following process parameters are used for the removal of the binder metal: the filament temperature T = 2250°–2300° C., the gap D between the substrate and the source of dissociated hydrogen = 2.5–3 mm, the total pressure in the reaction chamber p=1.3-2 kPa, and the process time t=2.5-3 hours.

8. The process as claimed in claim 3 including one or more substrates arranged on both sides of hot filament elements arranged in a vertical plane.

9. The process as claimed in claim 3, wherein the binder metal is evaporated in the form of metastable hydrides.

10. The process as claimed in claim 3, wherein the substrate used is WC-Co cemented carbide.

11. A cemented cutting insert for machining tools produced by a process as claimed in claim 3.

* * * * *